United States Patent [19]

Liang et al.

[11] Patent Number: 4,853,364
[45] Date of Patent: Aug. 1, 1989

[54] DEVELOPER COMPOSITION COMPRISING PHENOL RESINS AND VINYLIC OR ACRYLIC RESINS

[75] Inventors: Rong-Chang Liang, Centerville; Emerson K. Colyer, Kettering, both of Ohio; Kelli J. Borello, Beaver Falls, Pa.

[73] Assignee: The Mead Corporation, Dayton, Ohio

[21] Appl. No.: 152,685

[22] Filed: Feb. 5, 1988

[51] Int. Cl.$^4$ .......................... C08G 8/12; D41M 5/00; D41M 5/18; D41M 5/22

[52] U.S. Cl. ..................................... 503/216; 503/217; 503/225; 430/138; 427/150; 427/147; 427/151; 427/152; 428/327

[58] Field of Search ............... 430/138, 211, 350, 961; 503/216, 217, 225; 427/150, 147, 151, 152; 428/327; 346/207, 214

[56] References Cited

U.S. PATENT DOCUMENTS

| | | | |
|---|---|---|---|
| 3,732,120 | 5/1973 | Brockett et al. | 503/210 |
| 3,864,146 | 2/1975 | Oda et al. | 503/210 |
| 3,874,895 | 4/1975 | Hayashi et al. | 503/225 |
| 3,924,027 | 12/1975 | Saito et al. | 427/150 |
| 3,983,292 | 9/1976 | Saito et al. | 503/212 |
| 4,025,490 | 5/1977 | Weaver | 428/326 |
| 4,226,962 | 10/1980 | Stolfo | 503/210 |
| 4,399,209 | 8/1983 | Sanders et al. | 430/138 |
| 4,440,846 | 4/1984 | Sanders et al. | 430/138 |
| 4,554,235 | 11/1985 | Adair et al. | 420/138 |
| 4,647,952 | 3/1987 | Pokora et al. | 503/225 |

FOREIGN PATENT DOCUMENTS 68-296  3/1984  Japan ................... 503/225

*Primary Examiner*—Paul R. Michl
*Assistant Examiner*—Patrick Doody
*Attorney, Agent, or Firm*—Smith & Schnacke

[57] ABSTRACT

A developer composition comprising first and second developer materials, said first developer material being a finely divided thermoplastic phenolic resin and said second developer material being a finely divided thermoplastic vinylic or acrylic resin containing pendant developer moieties, said first and second developer materials being sufficiently compatible that upon heating they coalesce to form a non-tackey, and scratch resistant film.

34 Claims, No Drawings

DEVELOPER COMPOSITION COMPRISING PHENOL RESINS AND VINYLIC OR ACRYLIC RESINS

BACKGROUND OF THE INVENTION

The present invention relates to a developer composition which is useful in providing visible images through reaction with an electron donating color precursor and which is useful in providing transparencies or in providing reproductions having a glossy finish. It more particularly relates to a developer sheet which is capable of providing a controlled degree of gloss ranging from matte to high gloss and which exhibits a combination of high image density and abrasion resistance.

The developer sheet of the present invention can be used in conjunction with imaging systems in which visible images are formed by image-wise transferring a color precursor to the developer sheet such as conventional pressure-sensitive or carbonless copy paper, photosensitive, and thermal recording papers.

Pressure-sensitive copy paper is well known in the art. It is described in U.S. Pat. Nos. 2,550,446; 2,712,507; 2,703,456; 3,016,308; 3,170,809; 3,455,721; 3,466,184; 3,672,935; 3,955,025; and 3,981,523.

Photosensitive imaging systems employing microencapsulated radiation sensitive compositions are the subject of commonly assigned U.S. Pat. Nos. 4,399,209 and 4,416,966 to The Mead Corporation as well as copending U.S. patent application Ser. No. 320,643 filed Jan. 18, 1982. These imaging systems are characterized in that an imaging sheet, which includes a layer of microcapsules containing a photosensitive composition in the internal phase, is image-wise exposed to actinic radiation. In the most typical embodiments, the photosensitive composition is a photopolymerizable composition including a polyethylenically unsaturated compound and a photoinitiator and is encapsulated with a color precursor. Exposure imagewise hardens the internal phase of the microcapsules. Following exposure, the imaging sheet is subjected to a uniform rupturing force by passing the sheet through the nip between a pair of pressure rollers in contact with a developer sheet whereupon the color precursor is image-wise transferred to the developer sheet where it reacts to form the image.

In applications in which the aforementioned pressure-sensitive and photosensitive imaging systems are used to reproduce photographic quality images, a high degree of gloss is often desired in the reproduction. Where a transparency is desired, the reproduction must also transmit light efficiently. These objectives are difficult to achieve using conventional developers.

SUMMARY OF THE INVENTION

With the introduction of imaging systems described in U.S. Pat. No. 4,399,209 and thermal transfer systems of the types described in Japanese Published Application No. 62-60694, a need has arisen to produce photographic quality reproductions by transfer of a color precursor to a developer sheet. The reproduction must possess a desired degree of gloss and, in addition, it must not easily crack, delaminate or abrade when handled in a manner analogous to a conventional photograph.

In two previous commonly assigned patent applications, developers which are capable of glossing are described. These applications are U.S. application Ser. No. 905,727, filed Sept. 9, 1986 and U.S. application Ser. No. 086,059, filed Aug. 14, 1987. Both applications describe the use of finely divided thermoplastic acidic resin particles as developer materials. These resins color a color precursor and upon heating coalesce into a gloss-imparting film. In the former application the resins are phenolic resins. In the latter they are microparticles containing (meth)acrylic or vinylic resins having pendant developer moieties (e.g., pendant phenolic or salicylic acid moieties).

The present invention relates to an improved composition wherein these two resins are used in combination. The phenolic resins described in the former application provide high density but are tacky, exhibit a high yellowing index, poor adhesion and cohesion, and tend to scratch easily. The acrylic resins described in the latter application exhibit excellent abrasion resistance but it is difficult to design acrylic resins which provide the high densities available with phenolic resins. In accordance with the present invention these two resins are used together and modifications are made in the acrylic and vinylic resins to make them sufficiently compatible with the phenolic resins such that the two materials will coalesce and form a continuous and optionally transparent film.

Accordingly, a principal object of the present invention is to provide a novel developer composition which is useful in providing photographic quality images.

A more particular object of the present invention is to provide a developer composition useful in forming high gloss images and which provides high density and abrasion resistance.

Another object of the present invention is to provide a developer composition which is a mixture of finely divided thermoplastic microparticles which are capable of reacting with a color precursor and subsequently coalescing into a thin transparent uniform film upon heating to their film forming temperature.

The developer composition of the present invention is a mixture of first and second finely divided thermoplastic developer materials wherein the first developer material is a finely divided thermoplastic phenolic resin and the second developer material is a finely divided thermoplastic vinylic or acrylic polymer having pendant developer moieties; the first and the second developer materials are each capable of reacting with an electron donating color former to produce a visible color and subsequently coalescing with each other and forming a continuous film. The combination of the first and second developer materials provides high density and film strength to resist abrasion and cracking.

In accordance with another embodiment of the invention, a developer sheet useful in providing transparencies is provided in which the developer composition is coated on a transparet substrate. In this embodiment, the indices of refraction of the first and second developer materials are sufficiently equal that the coalesced film is transparent or essentially transparent. If the indices of refraction are not sufficiently equal, an opaque or translucent film results because the size of the emulsion particles is close to visible light region and there is a lack of mixing during the fusion step. The latter film is satisfactory for use on a paper substrate where transparency is not required but it is not desirable for use in making transparencies.

In accordance with the present invention, the vinylic or acrylic developer resin must be compatible with the phenolic developer resin such that the two will coalesce into a strong film (i.e., a melt of the two resin forms a single phase). In transparencies, the index of refraction of the acrylic or vinylic resin must match that of the phenolic resin. However, it is difficult to have both compatibility and refractive index matched in an emulsion particle of homogeneous composition. To facilitate glossing and manufacture, the vinylic or acrylic resin and the phenolic resin should have a low melt flow temperature (MFT) such that the resins can be coalesced with heating but a sufficiently high minimum film forming temperature (MFFT) that they do not coalesce upon drying. As explained below these two properties are not consistent with one another.

The vinylic or acrylic developer material is preferably a microparticle formed by multi-stage emulsion or dispersion polymerization. This enables one to provide a developer having this unique combination of properties. By using a multi-stage emulsion or dispersion polymerization technique, a developer particle having a core-shell construction can be obtained in which the composition of the core of the particle is different than the composition of the shell(s). Compatibility with the phenolic resin can be built into the outer or outermost shell(s). In addition the shell(s) can be provided with a sufficiently high MFFT that the particle does not melt as the developer sheet is dried during its manufacture. The shell can also be provided with a higher capacity for hydrogen bonding and a higher concentration of developer moieties which favor compatibility and higher density. On the other hand, the core can be designed with a low MFT, which lowers the temperature and total amount of heat (e.g., heating time) required to coalesce the developer. In addition, in making developers for transparencies, the core composition is controlled to provide an index of refraction which essentially matches the index of refraction of the phenolic resin.

Accordingly, one manifestation of the present invention is a developer composition comprising a first and second developer material, said first developer material being a finely divided thermoplastic phenolic resin and said second developer material being a finely divided thermoplastic vinylic or acrylic resin containing pendant developer moieties.

Another manifestation of the present invention is a developer sheet carrying a layer of the developer composition described above.

Still another manifestation of the present invention is a developer composition useful in preparing transparencies wherein the indices of refraction of said first developer material and the core of the second developer materials are essentially equal such that upon coalescing said developer materials a transparent film is formed.

A still further manifestation is a developer composition wherein said second developer material is a microparticle prepared by emulsion or dispersion polymerization such that said second developer material has a core-shell construction wherein said shell is designed to be compatible with said first developer material and said core is designed to have a low MFT to reduce the temperature required to melt said second developer material and when the developer is used in making transparencies the core is designed to have an index of refraction which essentially matches the index of refraction of said first developer material.

Definitions

The term "core-shell" refers to a microparticle having a core portion and one or more concentric shell portions.

The term "developer moiety" refers to phenolic or salicylic moieties or derivatives thereof.

The term "(meth)acrylic" means acrylic or methacrylic in the alternative.

The term "compatible" means that upon coalescence the developers form essentially a single phase.

"Minimum film forming temperature" is determined in accordance with ASTM D5354.

DETAILED DESCRIPTION OF THE INVENTION

The phenolic developers used as one component of the developer composition of the present invention preferably range from about 0.1 to 25 microns in particle size and have a minimum film forming temperature greater than about 60° C. and a melt flow temperature less than about 135° C.

Many phenolic resins conventionally used as developer materials in pressure-sensitive recording materials are useful in the present invention. These resins may be the condensation product of phenols (including substituted phenols) and formaldehyde. The resins may be further modified to include amounts of salicylic acids or substituted salicylic acids to enhance image density in a manner known in the art.

Examples of phenolic resins useful in the present invention are described in U.S. Pat. Nos. 3,455,721; 3,466,184; 3,762,935; 4,025,490; and 4,226,962.

Another class of phenolic resin useful in the present invention is the product of oxidative coupling of substituted or unsubstituted phenols or biphenols. Oxidative coupling may be performed using various catalysts but a particularly desirable catalyst is the enzyme, horseradish peroxidase. A particularly desirable phenolic resin is described in commonly assigned U.S. Pat. No. 4,647,952. A still more particularly useful resin is prepared by oxidative coupling Bisphenol A with hydrogen peroxide in the presence of horseradish peroxidase. This reaction can be carried out in a mixed solvent of water, acetone, and ethylacetate. After reaction the resin can be pulverized and ground in water with zinc salicylate and salicylic acid to prepare a finely divided particle useful in the present invention.

Another preferred phenolic developer is a condensation product of formaldehyde and an alkylphenol, such as an alkylphenol monosubstituted by an alkyl group which may contain 1 to 12 carbon atoms. Examples of alkyl phenols are ortho- or para- substituted ethylphenol, propylphenol, butylphenol, amylphenol, hexylphenol, heptylphenol, octylphenol, nonylphenol, t-butylphenol, t-octylphenol, etc. These resins are preferably metallated by reaction with a metal salt selected from the group consisting of copper, zinc, aluminum, tin, cobalt and nickel salts. Most typically, the resins are zincated to improve development. The metal content of the resins generally is about 1 to 5% by weight but may range up to 15%. Examples of these resins are provided in U.S. Pat. Nos. 4,173,684 to Stolfo and 4,226,962 to Stolfo.

Another class of thermoplastic phenolic developer material is a resin-like condensation product of a polyvalent metal salt, such as a zinc salt, and a phenol, a phenol-formaldehyde condensation product, or a phenolsalicylic acid-formaldehyde condensation product. Examples of this developer material are available from Schenectady Chemical Inc. under the designations HRJ 4250, HRJ 4252, and HRJ 4542. These products are reported to be a metallated condensation product of an ortho- or para-substituted alkylphenol, a substituted salicylic acid, and formaldehyde.

Phenolic developer materials useful in the present invention may be formed into particles useful in the present invention by several processes. A developer material can be prepared in a conventional manner and ground, or a melt of the material can be atomized. Alternatively, a melt of the developer material can be injected into a rapidly agitated aqueous medium whereupon the melt is solidified as droplets which are recovered. The developer material can also be dissolved in a solvent/non-solvent system and the solvent (which is lower boiling than the non-solvent) removed. Other materials such as Schenectady HRJ 4250, HRJ 4252 and HRJ 4542 resins are obtained commercially in a dispersed form.

The (meth)acrylic or vinylic developers are preferably polymers or copolymers having a repeating unit of the formula (I), (II), or (III) in their structure:

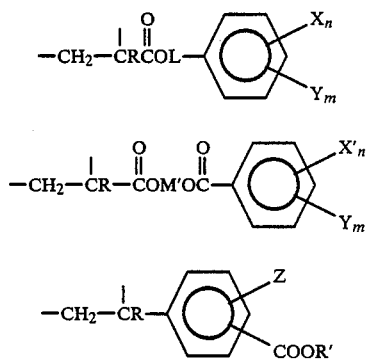

where
R is a hydrogen atom or a methyl group;
L is a direct bond or a spacer group;
X is —OH, —COOH, —OM, COOR' or a group of the formula (IV):

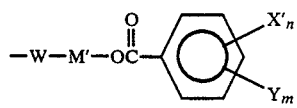

Y is an alkyl group, an aryl group, or an aralkyl group;
X' is —OH, —COOH, —OM, or —COOR';
W is —O— or —COO—;
Z is —OH or a hydrogen atom;
M is a metal atom;
M' is a divalent metal atom;
R' is a hydrogen atom, an alkyl group, or a metal atom as defined for M;
n is 1 or 2 and when n is 2, X or X' may be the same or different; and
m is 0, 1, or 2 and when m is 2; Y may be the same or different.

They may consist of units of the formulae (I)–(III) above but they are preferably copolymers of units of the formulae (I)–(III) and units derived from other copolymerizable monomers as discussed below in more detail.

They preferably have a melt flow temperature (MFT) less than about 135° C. and a minimum film forming temperature (MFFT) (ASTM D5354) greater than about 60° C.

Preferred developer resins are copolymers derived from one or more monomers of the following formulae:

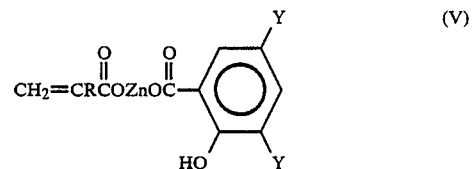

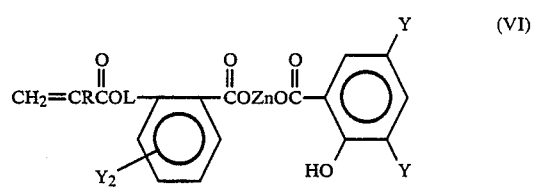

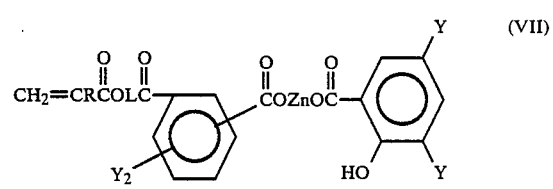

where R, Y, L and M are defined as above. The aforementioned monomers can be reacted as starting materials or, as explained below, they can be formed in situ by ligand exchange between an acidic monomer (e.g., acrylic or methacrylic acid) and a zinc salt (e.g., zinc salicylate, zinc 3,5 di-t-butyl salicylate, and the like) during polymerization of the acidic monomer.

The preferred (meth)acrylic or vinylic resins are thermoplastic copolymers obtained as microparticles by emulsion polymerization. The microparticles may range from about 0.01 to 20 microns in diameter.

Emulsion polymerization is used herein to design acrylic developers having unique combinations of properties.

In making coalescable thermoplastic microparticles it is desirable to form particles which are compatible with the phenolic resin and which have a low melt flow temperature but a high MFFT. A high MFFT prevents the particles from fusing together during drying. A low melt flow temperature enables the particles to be coalesced for glossing with minimum heating. As a general rule, a polymer which has a high MFFT will also have a high MFT, and a polymer having a low MFT will also have a low MFFT.

By forming the developer particles through a multistage emulsion polymerization process it is desirable to form particles having a core-shell construction in which:

(a) The core has a lower MFFT and MFT than the shell. Upon drying, the higher MFFT of the shell prevents the developer particles from coalescing. Upon glossing, on the other hand, the lower MFT of the core enables the core to melt readily, plasticize the shell and thereby reduce the temperature and the amount of heat required to gloss the developer.

(b) The shell composition is compatible with the phenolic resin such that when the two resins melt, they coalesce into a film. Typically, compatibility is established by incorporating a substantial amount of selected monomers into the shell composition of the acrylic microparticle. Concurrently, the composition of the core and shell are controlled such that they also are compatible. In this manner a continuity of properties is achieved which yields uniform film formation. For compatibility, quantities of the following can be: incorporated into the shell (i) functional monomers which form hydrogen bonds with phenolic resins such as units of the formulas I-III, 2-methoxyethyl (meth)acrylate, etc.; (ii) salicylic or phenolic moieties; or (iii) lower alkyl (meth)acrylates such as methyl (meth)acrylate.

(c) The refractive index of the core essentially matches the refractive index of the phenolic resin when making transparencies. Because the refractive index of (meth)acrylates is about 1.45 to 1.50 and a typical refractive index of a phenolic resin is about 1.55, in order to match refractive indices it is necessary to form copolymers of meth(acrylic) acid or esters with comonomers providing higher refractive indices. Polystyrene has a refractive index of 1.59. Hence, copolymers of styrene and (meth)acrylic acids and/or esters are good candidates for this purpose. On the other hand, polystyrene is not compatible with many phenolic resins. Therefore, to match refractive indices and at the same time maintain compatibility, a core-shell particle has been designed containing a high concentration of styrene in the core polymer and no styrene in the outermost compatible shell polymer. In this manner a particle is obtained having the necessary compatibility for coalescence and the matching refractive index for transparency. While the refractive index of the particle shell may not match exactly the refractive index of the phenolic resin, this does not appear to compromise transparency. Apparently the mixing of the phenolic and acrylic resin at the interface minimizes any effect due to the difference in refractive index.

The developer composition contains about 5 to 90% (solids) of acrylic or vinylic resin based on the total weight solids of the developer resins and preferably 20 to 50% of acrylic or vinylic resin based on total developer resin. The exact amount will vary depending on the nature of the resins used, the nature of the color formers, and the properties (density vs. abrasion resistance) required in a particular application. Generally, the good strength characteristics desired from the addition of the acrylic or vinylic resins are achieved with 25 to 35% acrylic or vinylic resin.

With reference to Formula (I), (II) and (III), X, Y, and M can be any of the substituents or metal ions found in phenolic, hydroxybenzoic acid or benzoic acid type developers. Representative examples of these developers are described in U.S. Pat. Nos. 3,864,146 to Oda; 3,924,027 to Saito et al.; 3,983,292 to Saito et al. and 4,219,219 to Sato.

X is typically selected from the group consisting of —OH, —COOH, —OM and —COOM where M is a metal atom selected from the group consisting of zinc, magnesium, calcium, copper, vanadium, cadmium, aluminum, indium, tin, chromium, titanium, cobalt, manganese, iron, and nickel. M is preferably zinc. X is preferably located ortho and/or para in formula (I) meta or para in formula (II). When the metal atom defined for M has a valency greater than 1, it is chelated with more than one developer moiety. In this case, the developer resin is crosslinked through the metal atom. For example, when X is COOZn in formula (I), the crosslinked unit can be represented by the formula (Ia):

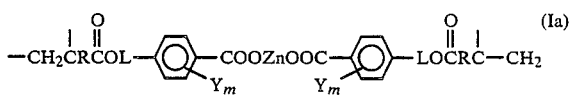

where R, L, Y and m, are defined as above.

In accordance with another embodiment of the present invention X is represented by the formula (IV)

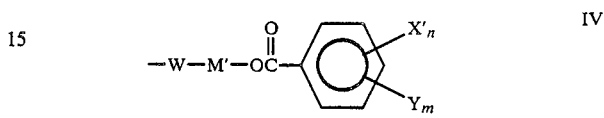

where W, M′, X′Y, m and n are defined above.

Y is typical an alkyl, an aryl or an aralkyl group such as a methyl, n-butyl, t-butyl, t-amyl, cyclohexyl, benzyl, α-methylbenzyl, α,α-dimethylbenzyl, diphenylmethyl, diphenylethyl, chlorophenyl, etc. Y is most preferably an oil solubilizing group such as an alkyl group containing 4 or more carbon atoms or a group containing a monocyclic or bicyclic carbon ring of 6 to 10 carbon atoms. Y is preferably located in positions corresponding to the 3 and 5 positions in salicylic acid.

The spacer group, L in formula (I) and (II), has two functions when it is not a direct bond, namely to stabilize the resin to hydrolysis and to improve developer activity by reducing steric hindrance. By inserting the spacer group L between the aromatic moiety and the carboxyl group the resulting monomer is more resistant to hydrolysis and thermal degradation.

The other function of the spacer group is simply to displace the developer moiety from the acrylic or vinylic polymer chain and reduce the glass transition temperature (Tg) of the polymer. If the developer moiety is coupled directly to the polymer chain, steric hindrance and rigidity of the chains may reduce the activity of the polymer as a developer and reduce film-forming ability.

Those skilled in the art will appreciate that a number of divalent atomic groups can be used as the spacer group L. The exact definition of the spacer group will vary with the nature of the reactants forming the developer moiety. For example, where the developer moiety is derived from a salicyclic acid, the spacer will include the phenolic oxygen atom from the acid. Where it is derived from phthalic acid, the spacer group will include one of the carboxyl groups from the acid. Representative examples of spacer groups are —CH$_2$C-H$_2$O—, —CH$_2$CH(OH)CH$_2$—, —O—CH$_2$CH(CH$_2$OH)—O—, and —(CH$_2$)n′—OCO— where n′ is an integer of 1 or more and preferably 2 to 6. These spacer groups result from reacting hydroxyalkyl esters or glycidyl esters of acrylic or methacryl acids with the developer compound, e.g., the aromatic acid or phenol. Other spacer groups are alkylene bridges having 3 or more carbon atoms and alkylene oxide bridges having 2 or more carbon atoms and one or more oxygen atoms.

Subject to compatibility with the phenolic resin and any requirements regarding refractive index, the acrylic resin may contain 1 to 100 wt % of the unit of formulae (I)-(III). The developer resins preferably contain about 10 to 60 wt. % of the unit of formulae (I)-(III) and still more preferably 15 to 40 wt. %. If the acrylic or vinylic resin consists of or contains a high amount of the moiety of formulae (I)–(III), it is very rigid and usually must be ground and dispersed in a binder for application herein.

The repeating unit of the formula (I) is typically derived from a monomer which is prepared by reacting acryloyl or methacryloyl acid chloride, or acrylic or methacrylic acid esters such as hydroxyalkyl esters or glycidyl esters with a metallated phenol or a metallated or non-metallated aromatic or hydroxyaromatic acid. One monomer useful in preparing developer resins in accordance with the present invention can be prepared by reacting phthalic anhydride with hydroxyethyl methacrylate in tetrahydrofuran (THF) to yield methacryloyloxyethyl monophthalate. Another monomer can be prepared by reacting a zinc 3,5-disubstituted disalicylate with glycidyl methacrylate or methacryloyl chloride in THF in the presence of a base (e.g., triethylamine in the case of methacryloyl chloride), or a Lewis acid (e.g. $ZnCl_2$ in the case of glycidyl methacrylate) to yield zinc o-methacryloyloxy(hydroxypropyl)oxybenzoate or zinc o-methacryloyloxy benzoate which is filtered, the THF removed, redissolved in ethyl ether and washed with 2% $NaHCO_3$, 0.5% HCl and saturated NaCl. Where X is represented by the formula (IV) above, the monomer is prepared as above but only one mol of the ester or acid chloride is reacted per mol of a difunctional metal salt.

Specific examples of monomers useful in providing the repeating unit of formula (I) are monomers of the formula (Ib)–(Ie)

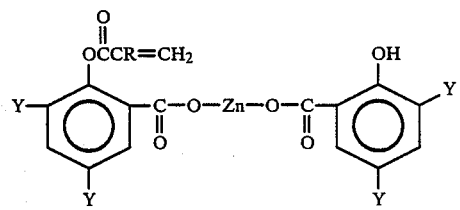
(Ib)

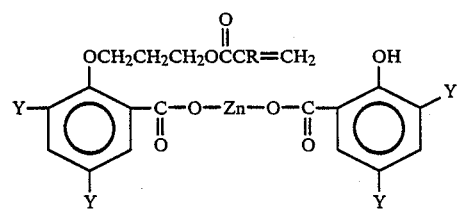
(Ic)

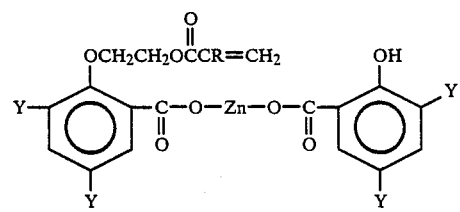
(Id)

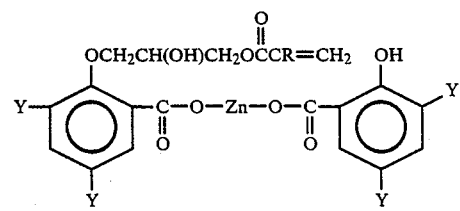
(Ie)

The repeating unit of formula (II) is derived from a mixed metal salt. The monomers yielding (II) can be prepared by reacting acrylic or methacrylic acid with a divalent metal salt of an aromatic acid in a ligand exchange reaction. The molar ratio of the monomer to the salt is such that the monomer displaces one but not both of the basic groups on the salt. This reaction can be conducted in situ as shown in Example 1 below. Alternatively, the monomers yielding (II), can be prepared by dropwise adding zinc chloride or zinc sulfate solution to a mixture of sodium (meth)acrylate and sodium salicylate (the sodium (meth)acrylate) solutions added in slight excess). The mixed salt will precipitate out.

Specific examples of monomers useful in providing unit (II) are monomers of the formula (IIa)

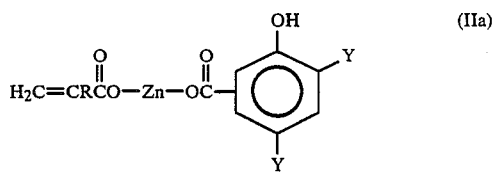
(IIa)

The repeating unit of formula (III) is derived from monomers such as 3-vinylsalic-vlic acid, 3-vinylbenzoic acid, 4-vinylsalicylic acid, 4-vinylbenzoic acid and 5-vinylsalicylic acid. These compounds may be metallated. They are particularly desirable for incorporating into the acrylic resin when high resistance to ultraviolet radiation is desired.

Substantially any monomer which is copolymerizable with acrylic or methacrylic acid, acrylates, or methacrylates may be reacted with the aforesaid monomers to produce copolymers useful in the present invention. Copolymerizable monomers that may be used to provide the copolymers of the invention are most typically acrylic or methacrylic acid and vinyl monomers such as styrene, vinylacetate, vinylidene chloride, and acrylic or methacrylic acid esters having 1 to 12 carbon atoms in the ester moiety. The monomer is preferably but not necessarily water insoluble.

Monomers useful in increasing refractive index of a (meth)acrylate copolymer include styrene, phenylacrylate, benzyl methacrylate, vinylidine chloride, and others. These latter monomers are generally selected on the basis that homopolymers of the monomers have refractive indices greater than about 1.55.

Representative examples of acidic co-monomers include acrylic acid, methacrylic acid, maleic acid and itaconic acid. Examples of acrylates and methacrylates include methyl methacrylate, isobutyl methacrylate, n-butyl methacrylate, ethylhexyl acrylate, ethyl acrylate, etc. Diacrylate and triacrylate monomers such as hexane diacrylate, zinc diacrylate and zinc dimethacrylate may be used if crosslinking is desired.

Monomers of the formulae (I) or (II) can be compolymerized with a low molecular weight zincated monomer. This is advantageous because it increases the concentration of zinc in the developer resin. Zinc concentrations greater than 4% by weight and preferably greater than 5% by weight are desirable for the acrylic or vinylic developer resin. Useful examples of such zincated monomers are zinc dimethacrylate, zinc diacrylate, zinc itaconate and zinc maleate. These monomers are preferably reacted in an amount of 1 to 20% by weight and preferably 1 to 10% by weight. In selecting from these monomers, zinc diacrylate and zinc dimethacrylate are difunctional and crosslink the resin. They can be used to crosslink the microparticle core to give it a degree of elastomeric character. On the other hand, zinc itaconate and zinc maleate are non-crosslinking monofunctional monomers and as such they can be used to increase the effective zinc concentration in the shell without crosslinking.

The copolymerizable monomer and the amount in which it is used as well as the nature of the monomers yielding formulae (I)–(III) can be varied to provide the desired developing activity, film forming temperature and degree of tack. It is known in the art that properties such as tack, film forming temperature and glass transition temperature (Tg) can be controlled by polymerizing blends of monomers. For example, a copolymer of a monomer associated with a high Tg and a monomer associated with a low Tg produces a copolymer having an intermediate Tg.

By selecting the appropriate comonomers, in different stages of the core-shell emulsion polymerization, acrylic and vinylic resins can be prepared with specified melt flow temperatures (MFT), e.g., 100° to 130° C. (pressure free, 1 minute) and with specified minimum film forming temperatures (MFFT, ASTM D5354) e.g., 60°–80° C. Water based coatings of these resins can be oven dried at temperatures of about 60°–80° C. without coalescence and the developer can still be readily coalesced after reaction with the color former by heating to temperatures of about 100°–130° C.

The composition of the acrylic and vinylic developer resins between the core and the shell of the microparticle and optionally at intermediate points in an emulsion polymerization process can be controlled by varying the nature and the amounts of the monomers reacted, however, the surfactants and initiators can also be varied to produce modifications in the properties of the microparticle. Emulsion polymerization processes have been conducted in from 2 to 6 stages. It is desirable to conduct the polymerization in a large number of stages in order to achieve a gradual transition from the properties and composition of the core polymer to the properties and composition of the shell polymer.

It has been found to be particularly desirable to form the acrylic or vinylic microparticle with a relatively soft, resilient core and a relatively hard, higher melting thermoplastic shell. In this manner, a coalescable developer particle can be formed which does not coalesce upon drying but readily coalesces upon heating to the melt flow temperature of the shell. Not only does this assist drying but these microparticles also require substantially less heat to coalesce than a homogeneous microparticle prepared from monomers having a lower Tg and the resulting coalesced film is durable and resists crazing.

Cross-linking the core, while optional, improves flexural resistance and reduces the tendency for a film of the developer resin to crack. About 0.5 to 5 wt % of a difunctional or polyfunctional crosslinking monomer may be used to crosslink the core. In this regard, in repeating units of the formula (I), when X is COOM or OM, and M is a polyvalent metal atom, the developer resin is crosslinked via the polyvalent metal atom. This can also be used in the core. Difunctional monomers are preferably not used in forming the shell polymer which must be thermoplastic.

Additionally, it is also desirable to form the microparticle such that the zinc (or metal) concentration is higher in the shell than in the core. The zinc enhances the reactivity of the resin and hence image density. The principal site for reaction of the developer resin and the color precursor is the shell and for this reason a high concentration of zincated compounds (preferably about 20 to 50 wt %) in the shell is preferred. However, to match refractive indices in the core and shell and improve resin transparency and core-shell compatibility, some zincated compound is generally used in forming the core as seen in the example.

The shell and core properties are easily adjusted during the emulsion polymerization process. The microparticle core is formed in the initial stage(s) of the emulsion polymerization process. During this stage or stages it is preferred to use monomers providing a low melt flow temperature.

The shell polymer preferably has a melt flow temperature of about 100° to 150° C. and preferably about 115° to 125° C. This enables the developer layer to be dried efficiently, limits tack, and allows the developer layer to be coalesced readily at temperatures below 130° C. If the shell polymer has a substantially lower melt flow temperature, the developer microparticles may coalesce prematurely at the time of drying. If the melt flow temperature is too high, excessive time and heat may be required to coalesce the microparticles. A typical shell monomer composition is about 25–30 wt % monomer yielding the unit of formulas (I)–(III), about 60–65 wt % methyl methacrylate, about 5 to 10 wt. % butyl acrylate, and about 1 to 5 wt. % of methacrylic acid.

The shell polymer composition should be optimized to provide good developing activity, prevent coalescence upon drying, provide good handling characteristics and provide compatibility with the phenolic resin. In addition to including high concentrations of the developer moiety containing monomer and zinc in the shell, it is also desirable to include higher concentrations (e.g., about 3 to 5 wt %) of acrylic or methacrylic acid. The latter monomers are desirable because they are ionic and stabilize the emulsion and they also catalyze dye development during image formation.

As discussed later, a metal (e.g., zinc) salt can also be post-mixed with the acrylic or vinylic developer to enhance its activity. By providing acrylic or methacrylic acid groups in the shell, the zinc salt can chelate with the developer particle and thereby enhance its activity.

Emulsion polymerization usually also requires the use of an appropriate surfactant and/or protective colloid to stabilize the emulsion and control the size of the microparticles. These materials are commonly referred to as emulsion stabilizers and dispersing agents. Those surfactants or protective colloids which are normally used in the emulsion polymerization of acrylates may be used herein. Representative examples include sodium dodecylbenzene sulfonate, ethylene oxide adducts of alkylphenols. Hydroxyethyl cellulose and polyviny pyrrolidone (PVP) are particularly desirable.

Conventional catalysts or initiators for the polymerization of acrylates are useful herein such as benzoyl peroxide, potassium persulfate, t-butyl peroxide, etc. Catalyst concentration may range from about 0.1 to 1% by weight.

The acrylic and vinylic developer resins of the present invention can be synthesized by several pathways. For example, in one method, aromatic developer moieties may be added to preformed acrylate or methacrylate homopolymers or copolymers and particularly polymers having acrylic or methacrylic acid or acid chloride derived units by reacting the polymer with phenols or salicylic acid compounds. However, this method is relatively expensive. In another method, a developer-moiety containing monomer is prepared and reacted in a free radical polymerization process. A third method is to react a zincated phenol or aromatic acid with acrylic or methacrylic monomers to produce a polymer in situ from which the developer moieties are pendant.

With regard to the latter two methods, phenolics are known inhibitors of free radical polymerization. It has been found, however, the monomers containing a phenolic moiety can be polymerized if the phenol is metallated. The same metal salts which are known to enhance the developing activity of phenols can also be used to prevent inhibition of polymerization. Accordingly, in accordance with the preferred embodiments of the invention, monomers useful in preparing the developer resins of the present invention are prepared from zincated or similarly metallated phenolics. The metallated phenolic must be carefully prepared and purified such that no unchelated phenolic material is present. A particularly useful phenolic purification technique is to dissolve the metallated phenol in chloroform or ether, filter, and wash first with 2% $NaHCO_3$ and then with saturated sodium chloride.

In accordance with another modification of the invention, nonpolymerizable developers can be post added directly to an emulsion of the acrylic or vinylic developer resin. These compounds may be compounds which are soluble in the developer resin such as zinc 3,5-di-t-butyl salicylate. If the polymer contains acid, ester or acid chloride groups, the zinc salts may react with the polymer in a ligand exchange reaction.

In another method, developer materials which are monomer soluble but not soluble in the developer resin can be added to an emulsion polymerization system prior to polymerization such that the compounds become entrained in the acrylic or vinylic developer resin during the polymerization process. Water soluble materials such as zinc chloride or zinc acetate can be added directly to the emulsion prior to coating. Generally, these materials may be added in an amount ranging from about 0 to 10 parts per 100 parts resin. They increase density, improve abrasion resistance and reduce tackiness.

Where the developer composition is mixed with a binder for coating, useful binders include butadiene copolymers, styrene copolymers, α-methylstyrene copolymers, polyvinyl chloride and vinylidene chloride copolymers, carboxylated styrene-butadiene copolymers, styrene alkylalcohol copolymers, etc. The developer resins may be incorporated in the binder in an amount of about 5 to 10,000 parts by weight developer per 100 parts binder.

In the case of developer resin emulsions, a water soluble binder of polyvinyl alcohol, hydroxyethyl cellulose, carboxymethyl cellulose, polyacrylic acid, polyvinyl phenol copolymers, etc. is used. A typical binder/resin ratio is about 0.5/100 to 5/100.

The acrylic and vinylic resins used in the present invention can also be prepared by other known methods for polymerizing acrylates or vinyl compounds including bulk polymerization and suspension polymerization, however, the preferred method is emulsion polymerization. Emulsion polymerization of acrylates is well known.

Useful substrates for developer sheets of the present invention include paper, synthetic papers, and transparent films such as polyethylene terephthalate film. Paper weight and film thickness will vary with the particular application.

The resin is preferably applied to the substrate in a dry coat weight of about 5 to 20 g/sq.cm.

While the present invention is particularly directed to developer compositions in which the acrylic or vinylic resin particle is an active developer, there are applications in which an inactive acrylic or vinylic resin may also be useful. If the phenolic resin is sufficiently active to compensate for any potential loss in density due to the inactivity of the acrylic or vinylic resin, an inactive acrylic or vinylic resin may be used to improve adhesion and cohesion without unfavorably compromising density.

The present invention is illustrated in more detail by the following non-limiting example.

EXAMPLE 1

The following emulsions and catalyst solutions were prepared:

| | Initial charge (g) | Pre-emulsion I (g) | Pre-emulsion II (g) | Pre-emulsion III (g) |
|---|---|---|---|---|
| Styrene | 9 | 23 | 14.41 | — |
| Methyl methacrylate | — | 6.9 | 14.41 | 18.36 |
| Butyl acrylate | | | | |
| N—dodecyl 16.1 | 1.17 | 2.74 | | |
| Methacrylic acid | 0.75 | 1.45 | 1.08 | 0.84 |
| N-dodecyl mercaptan | 0.054 | 0.138 | 0.09 | 0.063 |
| Zinc bis(3,5-di-t-butyl salicylate) | 0.9 | 2.3 | 6 | 6.4 |
| Abex 18S* (10% solution) | 17.9 | 15.9 | 11.35 | 8.13 |
| Deionized water | 30 | 34 | 31 | 23 |
| Hydroxyethylcellulose (2% solution) | 1.5 | — | — | — |

| Catalyst Solution | W-1 (g) | W-2 (g) | W-3 (g) | W-4 (g) |
|---|---|---|---|---|
| Ammonium persulfate | 0.4 | 0.07 | 0.07 | — |
| t-Butylhydroperoxide (10% solution) | — | — | 0.6 | — |
| Sodium bisulfite | — | — | — | 0.01 |
| Deionized water | 4 | 3 | 3 | 3 |
| Hydroxyethyl cellulose (2% solution) | — | — | 1.5 | — |

*Abex 18S: an anionic surfactant available from Alcolac, 3440 Fairfield Road, Baltimore, Maryland 21226.

The Initial Charge was heated to 73°–75° C. under nitrogen and stirred at 300–400 rpm. With continued stirring, catalyst solution W-1 was added. Thereafter, Pre-emulsion I was dropwise added to the reactor over a period of one hour and the reaction vessel was allowed to reach 80° C. and maintained at this temperature. After completing the addition of Pre-emulsion I, catalyst solution W-2 was added dropwise over a period of one hour followed by the addition of catalyst solution W-3. With the addition of catalyst solution W-3 completed, Pre-emulsion III was added dropwise over a period of one hour and maintained at a temperature of 80° C. for an additional hour. The reaction vessel was then allowed to cool to 65° C. and catalyst solution W-4 was added. The vessel was maintained at 65° C. for 30 minutes and then allowed to cool to room temperature. [The properties of the emulsion change as the polymerization advances and the catalyst solution is adjusted in the course of the reaction in response to these changes. For example, a more oil soluble catalyst is used in the third state of the polymerization because the water soluble catalyst used in the early stages will not dissolve in the polymer droplet which has grown substantially larger by the third stage. A different surfactant (HEC) is also used in the later stages as the zinc compounds are used in higher amounts since the zinc compounds complex with the surfactant used in the early stage and inactivate it.]

30 parts (solids) of the resulting emulsion was mixed with 70 parts (solids) phenolic resin dispersion HRJ 4542, commercially available from Schenectady Chemical, Inc. This mixture was applied to a transparent substrate and dried at 60° to 80° C.

The developer sheet was assembled with an imagewise exposed imaging sheet prepared in accordance with U.S. Pat. No. 4,399,209 and passed through a nip between a pair of pressure rollers. The developer sheet was separated from the imaging sheet and heated to 120°–130° C. for 1 minute to form a glossy image.

Having described the invention in detail and by reference to preferred embodiments thereof, it will be apparent that modifications and variations are possible without departing from the scope of the invention defined by the following claims.

What is claimed is:

1. A developer composition comprising first and second developer materials, said first developer material being a finely divided thermoplastic phenolic resin and said second developer material being a finely divided thermoplastic vinylic or acrylic resin containing pendant developer moieties, said first and second developer materials being sufficiently compatible that upon heating they coalesce to form a film.

2. The developer composition of claim 1 wherein said second developer material is prepared by emulsion polymerization and has a core portion and a shell portion and said shell portion is formed from a vinylic or acrylic polymer which is compatible with said phenolic resin.

3. The developer composition of claim 2 wherein said core portion is formed from a polymer having a melt flow temperature which is less than the melt flow temperature of the polymer forming said shell portion.

4. The developer composition of claim 3 wherein said phenolic resin is a phenol-formaldehyde resin.

5. The developer composition of claim 4 wherein said phenol-formaldehyde resin is a metallated alkylphenol-formaldehyde resin.

6. The developer composition of claim 3 wherein said phenolic resin is a product of oxidative coupling of a phenol or a biphenol.

7. The developer composition of claim 6 wherein said phenolic resin is a product of oxidative coupling of bisphenol A.

8. The developer composition of claim 3 wherein said phenolic resin is a metallated condensation product of a phenol, formaldehyde and a salicylic acid.

9. The developer composition of claim 1 wherein said first and second developer materials have a particle size of about 0.5 to 25 microns.

10. The developer composition of claim 3 wherein said acrylic or vinylic resin is a polymer having a repeating unit of formula (I), (II) or (III)

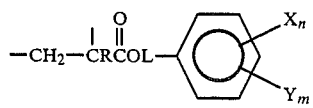 (I)

-continued

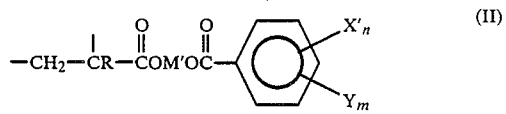 (II)

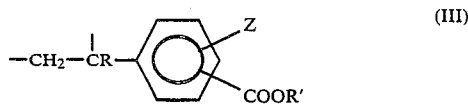 (III)

where

R is a hydrogen atom or a methyl group;

L is a direct bond or a spacer group;

X is —OH, —COOH, —OM, COOR' or a group of the formula (IV):

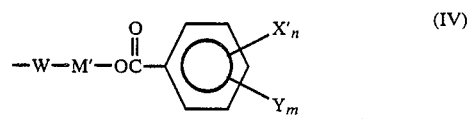 (IV)

Y is an alkyl group, an aryl group, or an aralkyl group;

X' is —OH, —COOH, —OM, or —COOR';

W is —O— or —COO—;

Z is —OH or a hydrogen atom;

M is a metal atom;

M' is a divalent metal atom;

R' is a hydrogen atom, an alkyl group, or a metal atom as defined for M;

n is 1 or 2 and when n is 2 X or X' may be the same or different; and m is 0, 1, or 2 and when m is 2 Y may be the same or different.

11. The developer composition of claim 10 wherein said acrylic or vinylic polymer has a melt flow temperature of about 80° C. to 130° C. (pressure free, 1 minute).

12. The developer composition of claim 11 wherein said polymer contains about 1 to 100 wt % of the repeating unit of formula (I)–(III).

13. The developer composition of claim 12 wherein said polymer is a copolymer of a monomer yielding the unit of the formula (I)–(III) and a monomer selected from the group consisting of acrylic acid, methacrylic acid, alkyl acrylates, alkyl methacrylates, styrene, vinyl acetate, and vinylidene chloride.

14. The developer composition of claim 1 wherein said developer materials exhibit a minimum film forming temperature greater than 60° C.

15. The developer composition of claim 10 wherein Y is selected from the group consisting of methyl, n-butyl, t-butyl, t-amyl, cyclohexyl, benzyl, α-methylbenzyl, α,α-dimethylbenzyl, diphenylmethyl, diphenylethyl, and chlorophenyl.

16. The developer composition of claim 3 wherein said core portion is formed from a polymer having a refractive index which approximately equals refractive index of said phenolic resin.

17. The developer composition of claim 3 wherein said shell portion is formed from a polymer having a melt flow temperature of about 100° to 150° C.

18. The developer composition of claim 13 wherein said acrylic or vinylic developer is a polymer having a repeating unit of the formula (II).

19. The developer composition of claim 1 wherein said composition contains about 5 to 90% by weight of said finely divided acrylic or vinylic resin.

20. The developer composition of claim 13 wherein said acrylic or vinylic resin is a polymer having a repeating unit of the formula (I).

21. The developer composition of claim 20 wherein said acrylic or vinylic resin is a polymer having a repeating unit of the formula (Ia)

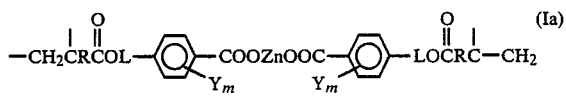

where R, L, Y and m are defined as in formula (I).

22. The developer composition of claim 20 wherein said acrylic or vinylic resin is derived from the monomer (Ib)

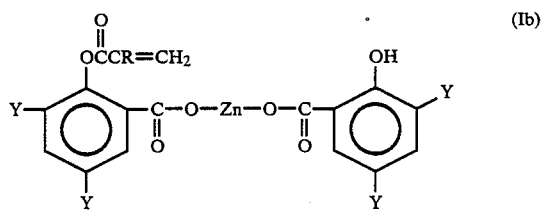

where R and Y are defined as in formula (I).

23. The developer composition of claim 20 wherein said acrylic or vinylic resin is a polymer derived from the monomer of the formula (Ic)

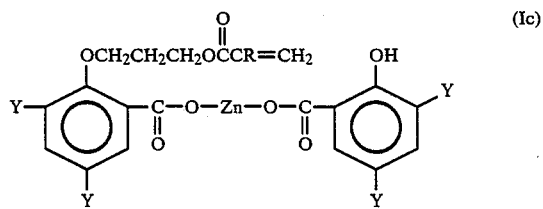

where Y and R are defined as in formula (I).

24. The developer composition of claim 18 wherein said acrylic or vinylic resin is dervived from a monomer of the formula (IIa)

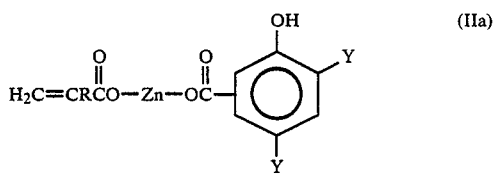

where R and Y are defined as in formula (II).

25. The developer composition of claim 13 wherein said acrylic or vinylic resin is a polymer having a repeating unit of the formula (III).

26. The developer composition of claim 19 wherein said composition contains about 20 to 50% by weight solids of said finely divided acrylic or vinylic resin.

27. The developer composition of claim 16 wherein said core portion is formed from a styrene copolymer.

28. The developer composition of claim 27 wherein said core portion is a polymer of styrene, methacrylic acid, butyl acrylate and zinc bis(3,5-di-t-butyl salicylate).

29. The developer composition of claim 28 wherein said shell portion is a copolymer of methyl methacrylate, butyl acrylate and methacrylic acid.

30. A developer sheet carrying a layer of developer composition in accordance with claim 1.

31. The developer sheet of claim 30 wherein said developer sheet carries a layer of a developer composition in accordance with claim 16 and said developer sheet is transparent.

32. A pressure-sensitive recording material including the developer sheet of claim 1.

33. The photosensitive recording material including the developer sheet of claim 1.

34. The developer composition of claim 1 wherein said finely divided thermoplastic phenolic resin is selected from the group consisting of a condensation product of formaldehyde and a phenol, the oxidative coupling product of a substituted or unsubstituted phenol or biphenol, and condensation products of a polyvalent metal salt and a phenol, a phenol-formaldehyde condensation product, or a phenol salicylic acid-formaldehyde condensation product.

* * * * *